(12) United States Patent
Eguchi et al.

(10) Patent No.: US 11,665,876 B2
(45) Date of Patent: May 30, 2023

(54) COMPONENT SUPPLY DEVICE, COMPONENT SUPPLY MANAGEMENT SYSTEM, AND COMPONENT SUPPLY WORKING SUPPORT METHOD (71) Applicant: Panasonic Intellectual Property Management Co., Ltd., Osaka (JP)

(72) Inventors: Ryouji Eguchi, Fukuoka (JP); Takashi Tamura, Fukuoka (JP); Kazunori Kanai, Fukuoka (JP); Masahiro Hayashizaki, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 76 days.

(21) Appl. No.: 17/245,616

(22) Filed: Apr. 30, 2021

(65) Prior Publication Data

US 2021/0251114 A1 Aug. 12, 2021

Related U.S. Application Data (63) Continuation of application No. 16/135,583, filed on Sep. 19, 2018, now Pat. No. 11,032,961.

(30) Foreign Application Priority Data

Sep. 25, 2017 (JP) .............................. JP2017-183701

(51) Int. Cl.
*H05K 13/08* (2006.01)
*H05K 13/04* (2006.01)
*H05K 13/02* (2006.01)

(52) U.S. Cl.
CPC ......... *H05K 13/086* (2018.08); *H05K 13/021* (2013.01); *H05K 13/0417* (2013.01); *H05K 13/0419* (2018.08)

(58) Field of Classification Search
CPC ....................... H05K 13/086; H05K 13/0419
See application file for complete search history.

(56) References Cited

U.S. PATENT DOCUMENTS 6,480,751 B1   11/2002   Kuribayashi et al.
9,310,789 B2 *  4/2016   Shimizu ............ H05K 13/0419
(Continued)

FOREIGN PATENT DOCUMENTS

JP      S62-239600 A    10/1987
JP      2008-192748 A    8/2008
(Continued)

*Primary Examiner* — Kaitlin S Joerger
(74) *Attorney, Agent, or Firm* — Pearne & Gordon LLP (57) ABSTRACT A component supply device including an accommodation body installation unit in which one or more accommodation bodies each accommodating components are installable, the component supply device sequentially operates the one or more accommodation bodies to supply each of the components to a predetermined component supply position. The component supply device comprises a supply state detector which detects a supply state of components in total accommodated in the one or more accommodation bodies installed on the accommodation body installation unit, a determination unit which determines, based on the supply state, a state of the accommodation body installation unit among (i) an installation disabled state, (ii) an installation enabled state, and (iii) an installation required state, and a notifier which notifies a worker of the state of the accommodation body installation unit determined by the determination unit.

18 Claims, 3 Drawing Sheets

(56) References Cited

U.S. PATENT DOCUMENTS

| | | | |
|---|---|---|---|
| 9,549,493 B2* | 1/2017 | Youngquist | H05K 13/0409 |
| 9,801,318 B2 | 10/2017 | Sumi | |
| 9,961,820 B2* | 5/2018 | Maezono | H05K 13/0417 |
| 10,058,020 B2 | 8/2018 | Maenishi et al. | |
| 10,405,469 B2 | 9/2019 | Eguchi et al. | |
| 10,462,946 B2 | 10/2019 | Takahashi et al. | |
| 10,477,746 B2 | 11/2019 | Kobayashi et al. | |
| 10,477,749 B2* | 11/2019 | Kato | H05K 13/086 |
| 10,517,201 B2* | 12/2019 | Ikeyama | H05K 13/0419 |
| 10,537,051 B2* | 1/2020 | Oyama | H05K 13/08 |
| 2017/0164530 A1 | 6/2017 | Yasuhira et al. | |
| 2018/0118387 A1* | 5/2018 | Eguchi | B65H 19/1852 |
| 2018/0220560 A1* | 8/2018 | Otsuka | H05K 13/0452 |
| 2018/0303014 A1 | 10/2018 | Taniguchi | |
| 2019/0037740 A1 | 1/2019 | Matsumori et al. | |
| 2019/0098809 A1* | 3/2019 | Eguchi | H05K 13/0419 |
| 2019/0313557 A1 | 10/2019 | Matsushita | |

FOREIGN PATENT DOCUMENTS

| | | |
|---|---|---|
| JP | 2016-081956 A | 5/2016 |
| JP | 2017-103374 A | 6/2017 |

\* cited by examiner

COMPONENT SUPPLY DEVICE, COMPONENT SUPPLY MANAGEMENT SYSTEM, AND COMPONENT SUPPLY WORKING SUPPORT METHOD

CROSS REFERENCE TO RELATED APPLICATION(S)

This application is a continuation of U.S. patent application Ser. No. 16/135,583 filed on Sep. 19, 2018, which claims the priority from Japanese Patent Application No. 2017-183701 filed on Sep. 25, 2017, the entire contents of which are incorporated herein by reference.

BACKGROUND

1. Technical Field

The present disclosure relates to a component supply device for supplying a component from an accommodation body in which components are accommodated, a component supply management system for managing the component supply of the component supply device, and a component supply working support method for supporting component supply working using the component supply device.

2. Description of the Related Art

In a component mounter for mounting component on a board, a tape feeder is frequently used as a component supply device for supplying component. The tape feeder has a configuration in which the carrier tape installed (inserted) from a tape installation port is fed at a pitch by a rotation operation of a sprocket to supply a component accommodated in a carrier tape to a predetermined component supply position. In the related art, in the tape feeder, in order to travel a following carrier tape (following tape) following a leading carrier tape (leading tape), it is necessary to connect (splice) a leading portion of the following tape to a terminal end portion of the leading tape before the terminal end portion of the leading tape passes through the tape installation port of the tape feeder.

In recent years, an automatic loading type tape feeder that loads carrier tapes and feeds at a pitch automatically has been developed in order to alleviate the burden of replenishment work of carrier tapes by the worker. In this automatic loading type tape feeder, if the following tape is installed on the tape installation port before the terminal end portion of the leading tape passes the tape installation port, since the following tape follows the terminal end portion of the leading tape so that feeds at a pitch, splicing of a carrier tape as in the related art is unnecessary (for example, Japanese Patent Unexamined Publication No. 2017-103374). Therefore, an automatic loading type tape feeder is also called a splicingless feeder.

However, in the splicingless feeder, since it is possible to install a plurality of carrier tapes at the same time, there was a problem that it is difficult to grasp the time when the following carrier tapes should be installed from an outer appearance during the component supply working.

Therefore, an object of the present disclosure is to provide a component supply device, a component supply management system, and a component supply working support method capable of easily grasping the timing of installing of a following carrier tape and improving a work efficiency of component supply work.

SUMMARY

According to the present disclosure, there is provided a component supply device including an accommodation body installation unit in which one or more accommodation bodies each accommodating components are installable, the component supply device sequentially operates the one or more accommodation bodies to supply each of the components to a predetermined component supply position. The component supply device comprises a supply state detector which detects a supply state of components in total accommodated in the one or more accommodation bodies installed on the accommodation body installation unit, a determination unit which determines, based on the supply state, a state of the accommodation body installation unit among (i) an installation disabled state of being incapable of installing a following accommodation body to the accommodation body installation unit, (ii) an installation enabled state of being capable of installing the following accommodation body to the accommodation body installation unit, and (iii) an installation required state of being necessary to install the following accommodation body to the accommodation body installation unit, the following accommodation body being an accommodation body to be perform the supply immediately after the one or more accommodation bodies, and a notifier which notifies a worker of the state of the accommodation body installation unit determined by the determination unit.

According to the present disclosure, there is provided a component supply management system which manages component supply of a component supply device including an accommodation body installation unit in which one or more accommodation bodies each accommodating components are installable, the component supply device sequentially operates the one or more accommodation bodies to supply each of the components to a predetermined component supply position. The component supply management system comprises a supply state detector which detects a supply state of components in total accommodated in the one or more accommodation bodies installed on the accommodation body installation unit, a determination unit which determines, based on the supply stat, a state of the accommodation body installation unit among (i) an installation disabled state of being incapable of installing the following accommodation body to the accommodation body installation unit, (ii) an installation enabled state of being capable of installing the following accommodation body to the accommodation body installation unit, and (iii) an installation required state of being necessary to install the following accommodation body to the accommodation body installation unit, the following accommodation body being an accommodation body to be perform the supply immediately after the one or more accommodation bodies, and a notifier which notifies a worker of the state of the accommodation body installation unit determined by the determination unit.

According to the present disclosure, there is provided a component supply working support method for supporting a component supply working using a component supply device including an accommodation body installation unit in which one or more accommodation bodies each accommodating components are installable, the component supply device sequentially operates the one or more accommodation bodies to supply each of the components to a predetermined component supply position. Then, the component supply working support method comprises a supply state detecting step of detecting a supply state of the component in total accommodated in the one or more accommodation bodies installed on the accommodation body installation unit, a determining step of determining, based on the supply state, a state of the accommodation body installation unit among (i) an installation disabled state of being incapable of installing the following accommodation body to the accommodation body installation unit, (ii) an installation enabled state of being capable of installing a following accommodation body to the accommodation body installation unit, and (iii) an installation required state of being necessary to install the following accommodation body to the accommodation body installation unit, the following accommodation body being an accommodation body to be perform the supply immediately after the one or more accommodation bodies, and an notifying step of notifying a worker of the state of the accommodation body installation unit determined in the determining step.

According to the present disclosure, it is possible to easily grasp the timing of installation of the following carrier tape, and it is possible to improve the working efficiency of the component supply working.

DETAILED DESCRIPTION

Figure 1:
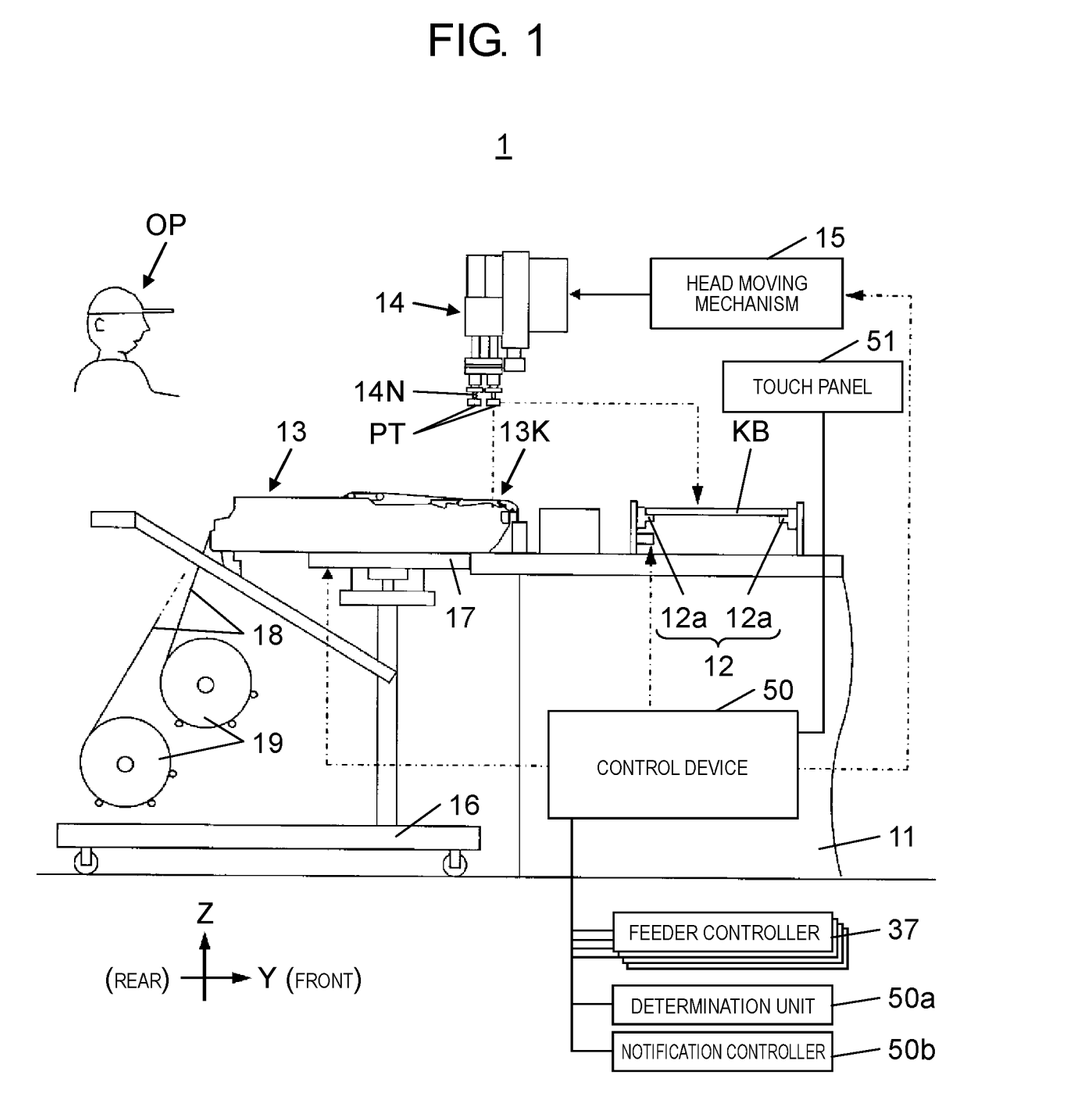
FIG. 1 is a side view of a main portion of a component mounter according to an exemplary embodiment of the present disclosure.

Hereinafter, exemplary embodiments of the present disclosure will be described with reference to the drawings. FIG. 1 illustrates component mounter 1 according to an exemplary embodiment of the present disclosure. Component mounter 1 operates to mount component PT on board KB carried in from the upstream side and carry board KB out to the downstream side.

In this exemplary embodiment, a left and right direction (direction orthogonal to paper surface of FIG. 1) viewed from worker OP is taken as an X-axis direction and a front and rear direction viewed from worker OP (left-right direction of page surface of FIG. 1) is taken as a Y-axis direction.

In addition, an up and down direction (up and down direction of page of FIG. 1) is a Z-axis direction.

In FIG. 1, component mounter 1 includes base 11, board transporter 12, a plurality of tape feeders 13, installation head 14, and head moving mechanism 15. Board transporter 12 is configured with a pair of conveyor mechanisms 12a and transports board KB in the X-axis direction to position board KB at a predetermined work position. The plurality of tape feeders 13 are attached side by side in the X-axis direction to feeder base 17 (see also FIG. 2) as a portion of carriage 16 connected to base 11. Reel 19 on which carrier tape 18 accommodating component PT is wound is held on carriage 16. Each tape feeder 13 feeds carrier tape 18 pulled out from reel 19 at a pitch to supply component PT to component supply port 13K, as a supply position of component PT.

In FIG. 1, installation head 14 includes a plurality of nozzles 14N extending downward. Each of nozzles 14N can move up and down and rotate around the Z axis, and a vacuum suction force for sucking component PT can be generated at the lower end of each nozzle 14N. Head moving mechanism 15 moves installation head 14 in the horizontal plane direction.

Installation head 14 sucks component PT to be supplied to component supply port 13K by tape feeder 13 by nozzle 14N and mounts component PT on board KB.

Figure 2:
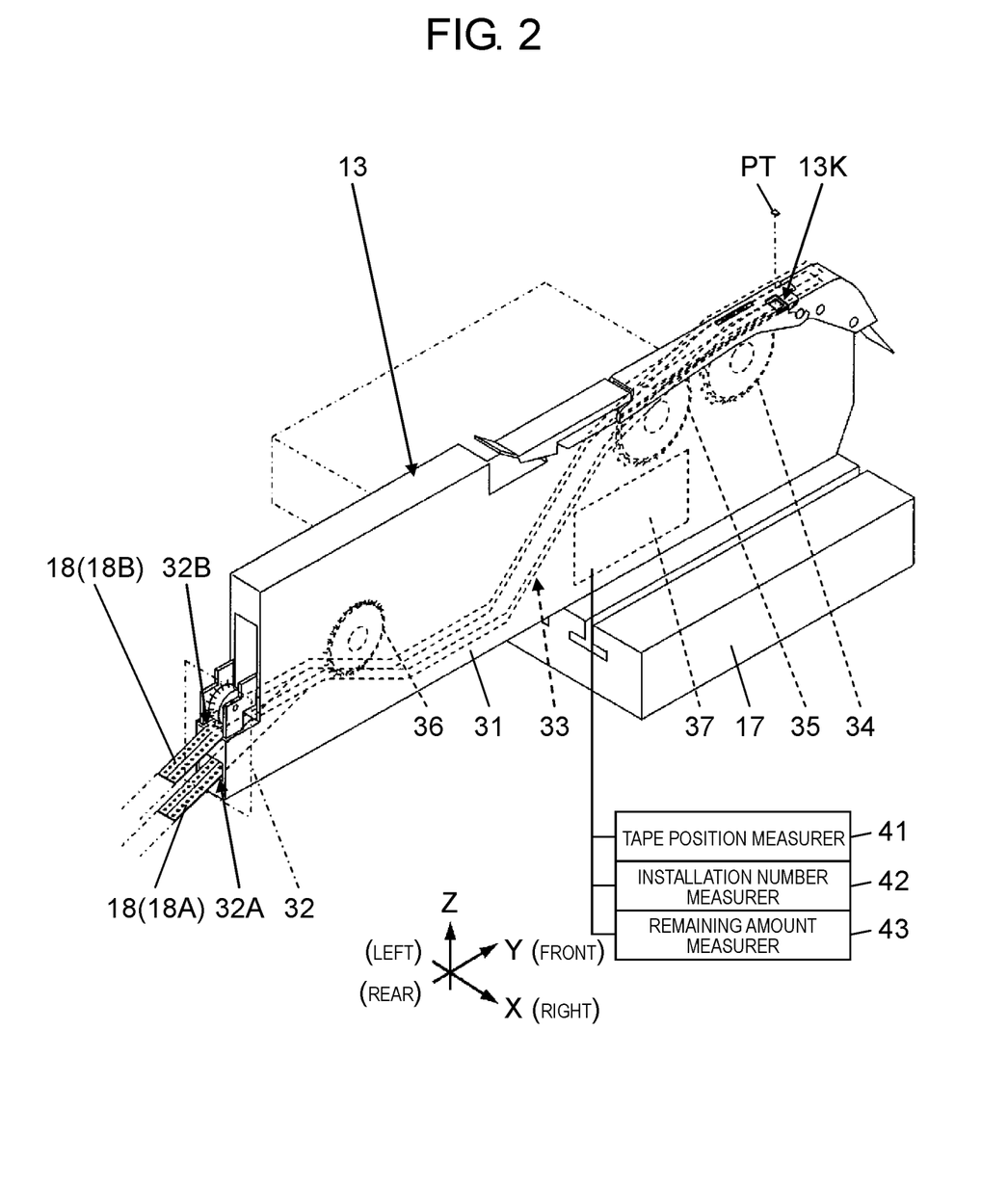
FIG. 2 is a perspective view of a tape feeder in which a component mounter is included according to an exemplary embodiment of the present disclosure.

In component mounter 1 having such a configuration, as illustrated in FIG. 2, tape feeder 13 has main body portion 31 detachably attached to feeder base 17. Tape installation unit 32 for installing carrier tape 18 is provided on the rear portion (side of worker OP) of main body portion 31. Tape installation unit 32 has two upper and lower tape installation ports (lower stage side installation port 32A and upper stage side installation port 32B).

In a case where lower stage side installation port 32A is a place where carrier tape 18 is installed (inserted) in preference to upper stage side installation port 32B and carrier tape 18 is not installed on tape feeder 13, carrier tape 18 is installed on the lower stage side installation port 32A. Upper stage side installation port 32B is a place where following (replenishment) carrier tape 18 is installed (inserted) and is used when carrier tape 18 is already attached to lower stage side installation port 32A. In other words, in the present exemplary embodiment, a plurality of carrier tapes 18 can be installed on tape installation unit 32 at the same time.

In FIG. 2, in main body portion 31, tape path 33, which is a traveling path of carrier tape 18, is formed to extend forward from the rear of main body portion 31. Main sprocket 34 that feeds carrier tape 18 in tape path 33 forward at a pitch is provided in a portion of a front end side of main body portion 31, and a sub sprocket 35 is provided in a rear position adjacent to main sprocket 34. Further, feed sprocket 36 is provided in the rear end side portion of main body portion 31. The rotation of main sprocket 34, sub sprocket 35, and feed sprocket 36 is controlled by feeder controller 37 provided in main body portion 31.

Feed sprocket 36 is engaged with carrier tape 18 inserted into tape path 33 from lower stage side installation port 32A and rotates to feed carrier tape 18 forward. Secondary sprocket 35 engages with carrier tape 18 forwardly fed by feed sprocket 36 and rotates to deliver carrier tape 18 to main sprocket 34. Main sprocket 34 engages with carrier tape 18 received from sub sprocket 35 and rotates at a pitch to feed carrier tape 18 at a pitch toward component supply port 13K. After the leading portion of carrier tape 18 reaches main sprocket 34 and main sprocket 34 starts feeding of carrier tape 18 at a pitch, sub sprocket 35 and feed sprocket 36 do not feed carrier tape 18, and conversely is in a free rotation state where it is driven and rotated by carrier tape 18.

As described above, in a case where tape feeder 13 in the present exemplary embodiment is a so-called automatic loading type tape feeder (splicingless feeder), following carrier tape 18 (referred to as following tape 18B) is transported following carrier tape 18 (referred to as leading carrier tape 18A) which precedes and feeds at a pitch, following tape 18B may be installed on tape installation unit 32. Therefore, it is unnecessary to connect the leading portion of following tape 18B to the terminal end portion of leading tape 18A with a tape member.

In main body portion 31 of tape feeder 13, a plurality of sensors (not illustrated) and tape position measurer 41 are provided. A plurality of sensors (not illustrated) detects the path of the leading portion, the terminal end portion, or the like of carrier tape 18 traveling in tape path 33, and transmits the detected passing information to feeder controller 37 (FIG. 2). Then, tape position measurer 41 measures the presence or absence (position) of carrier tape 18 from the transmitted path information.

A procedure of installing new following tape 18B to tape installation unit 32 on tape feeder 13 to which leading tape 18A is attached will be described. In a case where the terminal end portion of leading tape 18A has not yet reached lower stage side installation port 32A (lower stage side installation port 32A is not empty), following tape 18B is attached to upper stage side installation port 32B. The leading portion of following tape 18B installed on upper stage side installation port 32B passes through the upper area of leading tape 18A and waits at the point of engagement with feed sprocket 36. Then, when the terminal end portion of traveling leading tape 18A passes (overtakes) through the leading portion of waiting following tape 18B and is measured by the sensor (tape position measurer 41) located near the middle of tape path 33, feed sprocket 36 is rotated and driven by feeder controller 37. As feed sprocket 36 rotates and drives, following tape 18B travels in tape path 33 so as to follow leading tape 18A, and is delivered to main sprocket 34 to be sent. Accordingly, following tape 18B is switched to leading tape 18A.

Next, the procedure for newly installing following tape 18B to tape installation unit 32 after following tape 18B is switched to leading tape 18A will be described. Leading tape 18A switched from following tape 18B is installed on upper stage side installation port 32B. Therefore, worker OP replaces leading tape 18A with the lower stage side installation port 32A and empties the upper stage side installation port 32B. Then, worker OP installs following tape 18B on emptied upper stage attachment port 32B. Following tape 18B installed on upper stage side installation port 32B is pushed by worker OP so as to advance through tape path 33 as it is, and the leading portion thereof is engaged with feed sprocket 36. Thereafter, when the terminal end portion of leading tape 18A passes through (overtakes) the leading portion of following tape 18B and is measured by the sensor (tape position measurer 41) near the middle of tape path 33, feed sprocket 36 starts rotating. As a result, following tape 18B travels in tape path 33 so as to follow leading tape 18A, is delivered to main sprocket 34 to be sent.

Tape feeder 13 feeds carrier tape 18 sent at a pitch in the manner described above by the rotation operation of main sprocket 34, and supplies component PT accommodated in carrier tape 18 to component supply port 13K. As described above, in the present exemplary embodiment, tape feeder 13 provide tape installation unit 32 (accommodation body installation unit) capable of simultaneously installing a plurality of carrier tapes 18 (accommodation bodies) accommodating component PT. Then, tape feeder 13 is component supply device that operates so that component PT is supplied from one of one or more carrier tapes 18 installed on tape installation unit 32 to a predetermined component supply position (component supply port 13K).

Here, the installation port for installing carrier tape 18 to tape installation unit 32 are two of lower stage side installation port 32A and upper stage side installation port 32B, but it is also possible to provide three or more installation ports. In this case, carrier tape 18 is installed (inserted) in preference to the upper installation port with the lower attachment port. Even with tape feeder 13 configured as described above, the tape feeder can have a configuration operating so that component PT is supplied from one of one or more carrier tapes 18 installed on tape installation unit 32 to a predetermined component supply position (component supply port 13K).

In main body portion 31 of tape feeder 13, installation number measurer 42 is provided. Installation number measurer 42 counts the number of carrier tapes 18 installed on tape installation unit 32 and transmits the measured information thereof to feeder controller 37 (FIG. 2). Therefore, feeder controller 37 can grasp how many carrier tapes 18 are inserted into tape installation unit 32, that is, whether or not tape installation unit 32 is in a state where carrier tape 18 can be installed (inserted).

In addition, in main body portion 31 of tape feeder 13, remaining amount measurer 43 is also provided. Remaining amount measurer 43 counts the suppliable remaining amount of component PT by carrier tape 18 traveling in tape path 33, that is, carrier tape 18 (hereinafter, referred to as component supply tape. Leading tape 18A corresponds to component supply tape in relation to following tape 18B) which supplies component PT at present, and transmits the measured information to feeder controller 37 (FIG. 2). Here, "suppliable remaining amount of component PT by component supply tape" may be regarded as the remaining number of component PT of the component supply tape itself, or may be regarded as a length from the terminal end portion of the component supply tape to lower stage side installation port 32A.

Remaining amount measurer 43 counts the remaining number of component PT of the component supply tape, the position of the boundary between the area where components PT are accommodated and the area where components PT are not accommodated in the component supply tape, or the suppliable remaining amount of component PT by the component supply tape by measuring at least one of the remaining length of the component supply tape. Detection of the suppliable remaining amount of each detection target will be described below.

In a case where remaining amount measurer 43 is a device (remaining number measurer) for counting the remaining number of component PT of the component supply tape, the suppliable remaining amount is measured as follows. First, remaining amount measurer 43 calculates the remaining number of components PT accommodated in the component supply tape, based on the data of component number read at the time when component PT at the leading of the component supply tape arrives at component supply port 13K and the number of pitch feeds after component PT at the leading of the component supply tape reaches component supply port 13K. Then, based on the calculated remaining number of component PT, remaining amount measurer 43 obtains the suppliable remaining amount of component PT by the component supply tape.

In a case where remaining amount measurer 43 measures the position of the boundary between the area where components PT are accommodated and the area where component PT is not accommodated on the component supply tape, remaining amount measurer 43 determines the suppliable remaining amount as described below. First, remaining amount measurer 43 checks the presence or absence of component PT accommodated in carrier tape 18 (leading tape 18A). Specifically, remaining amount measurer 43 grasps the position of the boundary as the periodicity of the presence or absence of component PT changes. Remaining amount measurer 43 is provided, for example, in the vicinity of lower stage side installation port 32A and is configured with a light sensor having a light projecting unit and a light receiving unit. Then, based on the position of the grasped boundary and the length to the terminal end portion of carrier tape 18, the remaining amount measurer obtains the suppliable remaining amount of component PT by the component supply tape.

In a case where remaining amount measurer 43 is to detect the remaining length of the component supply tape, the suppliable remaining amount is measured as described below. First, remaining amount measurer 43 measures the remaining length of the component supply tape from the position of carrier tape 18 (that is, component supply tape) in tape path 33 measured by tape position measurer 41 and the length of carrier tape 18 stored in advance. Then, based on measured remaining length of component PT supply tape, remaining amount measurer 43 obtains the suppliable remaining amount of component PT by the component supply tape.

By combining information on the installing state of carrier tape 18 in tape installation unit 32 obtained by installation number measurer 42 and information on the suppliable remaining amount of component PT by the component supply tape which is carrier tape 18 which is currently supplying component PT and it is possible to detect the supply state of component PT on total at least one carrier tape 18 installed on tape installation unit 32 of tape feeder 13. Therefore, in the present exemplary embodiment, installation number measurer 42 and remaining amount measurer 43 of tape feeder 13 serve the supply state detector which detects the supply state of component PT on total at least one carrier tape 18 installed on tape installation unit 32 of tape feeder 13.

In FIG. 1, control device 50 of component mounter 1 controls the transportation of board KB by board transporter 12. In addition, control device 50 controls the movement of installation head 14 by head moving mechanism 15. In addition, control device 50 controls the operation of nozzle 14N by installation head 14 and the suction by nozzle 14N. Feeder controller 37 of each tape feeder 13 attached to feeder base 17 is connected to control device 50. The position information of the component supply tape in tape feeder 13 obtained by feeder controller 37 of each tape feeder 13, the information on the number of carrier tapes 18 installed on tape installation unit 32, suppliable remaining amount information of component PT by the component supply tape, and the like are transferred to control device 50.

Touch panel 51 is connected to control device 50, and worker OP can make necessary inputs to control device 50 through touch panel 51. In addition, control device 50 gives various instructions to worker OP through touch panel 51 and also notifies the information. Touch panel 51 need not be provided in component mounter 1 and may be, for example, a mobile terminal, or the like possessed by worker OP.

In FIG. 1, control device 50 of component mounter 1 includes determination unit 50a and notification controller 50b. Based on the information detected by the supply state detector (installation number measurer 42 and remaining amount measurer 43) of each tape feeder 13, determination unit 50a determines that tape installation unit 32 of each tape feeder 13 is in any state of "installation disabled state", "installation enabled state", and "installation required state". Notification controller 50b causes touch panel 51 to display the result (state of tape installation unit 32) determined by determination unit 50a and notifies worker OP of the content thereof.

Here, "installation disabled state" means a state where following tape 18B cannot be attached to tape installation unit 32, and the "installation enabled state" means a state where following tape 18B can be attached to tape installation unit 32. In addition, the "installation required state" means a state where tape installation unit 32 needs to be installed on following tape 18B.

In component mounter 1 according to the present exemplary embodiment, the system including tape feeder 13 including the supply state detector, determination unit 50a of control device 50, the both function units of the notification controller 50b, and touch panel 51 constitutes a component supply management system that manages the component supply of tape feeder 13 as a component supply unit. In this case, the notification controller 50b and touch panel 51 function as a notifier that notifies worker OP of the state of tape installation unit 32 determined by determination unit 50a.

Figure 3:
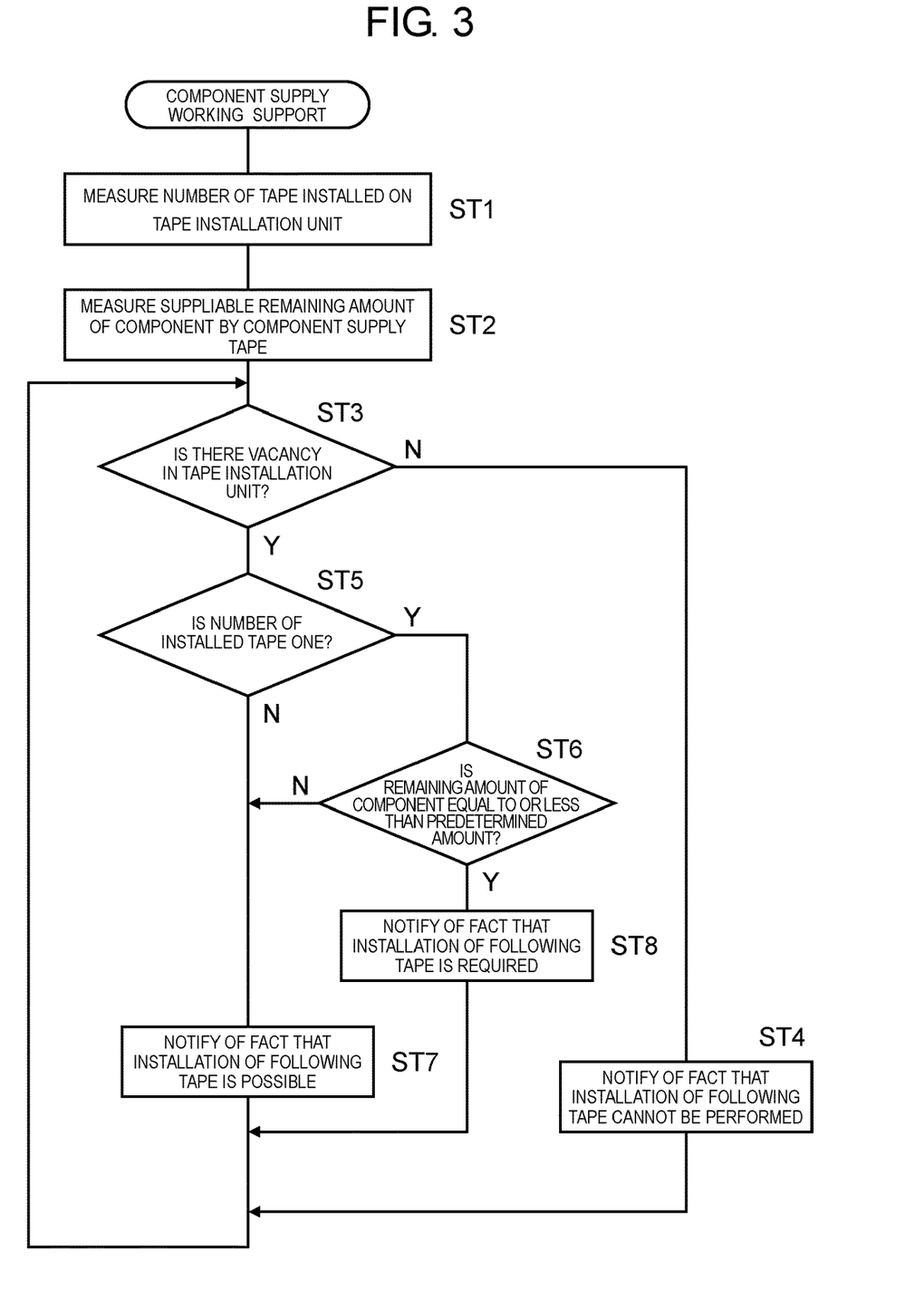
FIG. 3 is a flowchart illustrating a flow of component supply working support control executed by a component supply management system according to an exemplary embodiment of the present disclosure.

The flowchart illustrated in FIG. 3 illustrates the procedure (component supply working support method) of the component supply working support control executed by the component supply management system. Here, the component supply working support control means support control for enabling worker OP to easily grasp the timing of installation of following tape 18B with respect to tape feeder 13. The flowchart illustrated here illustrates a flow of procedures for any one of a plurality of tape feeders 13 attached to the feeder base 17, but it is based on the premise that it is a state where the target tape feeder 13 transports the component supply tape and the supply of component PT is in progress.

In the component supply working support control performed by the component supply management system, the number of carrier tapes 18 installed on tape installation unit 32 is first counted by installation number measurer 42 of target tape feeder 13 (installation number measuring step in step ST1 in FIG. 3). The number of carrier tapes 18 installed on tape installation unit 32 is measured based on the number of pieces of information on carrier tape 18 stored in component mounter 1 or tape feeder 13. Information on carrier tape 18 is of the ID code affixed to the surface of reel 19. The ID code is recognized by the scanner when worker OP attaches reel 19 to tape feeder 13. Then, the recognized ID code is stored in component mounter 1 or tape feeder 13 as information of carrier tape 18. In addition to the information on carrier tape 18, an optical sensor or the like having a light protruding portion and a light receiving portion may be provided on tape installation unit 32 to physically detect the number of carrier tapes 18.

In addition, remaining amount measurer 43 of tape feeder 13 counts the suppliable remaining amount of component PT by the component supply tape (remaining amount measuring step of step ST2). In the component supply working support control according to the present exemplary embodiment, the installation number measuring step in step ST1 and the remaining amount measuring step in step ST2 are supply state measuring steps measuring the supply state of component PT in at least one carrier tape 18 installed on tape installation unit 32 as an accommodation body installation unit.

When the number of carrier tapes 18 installed on tape installation unit 32 and the suppliable remaining amount of component PT by the component supply tape are measured, determination unit 50a determines whether there is space that can install (insert) carrier tape 18 on tape installation unit 32 (step ST3). The determination unit 50a makes this determination based on detection information from installation number measurer 42 sent from feeder controller 37 of target tape feeder 13.

In the present exemplary embodiment, the maximum number of carrier tapes 18 that can be inserted into tape installation unit 32 is two, and one (lower stage side installation port 32A) of carrier tapes 18 is occupied by the component supply tape. Therefore, if the number of carrier tapes 18 installed on tape installation unit 32 is one, determination unit 50a determines that "there is vacancy" and if the number of carrier tapes 18 installed on tape installation unit 32 is two (that is, if number of carrier tapes 18 counted by installation number measurer 42 is the same as the number of carrier tapes 18 that can be installed on tape installation unit 32), determination unit 50a determines that "there is no vacancy".

As described above, in the present exemplary embodiment, in a case where the number of carrier tapes 18 counted by installation number measurer 42 is the same as the number of carrier tapes 18 that is installed on tape installation unit 32, determination unit 50a determines that tape installation unit 32 is in the attachment disabled state.

In step ST3, in a case where determination unit 50a determines that "there is no vacancy", notification controller 50b notifies worker OP of the fact that carrier tape 18 cannot be attached to tape installation unit 32 (step ST4). This notification is performed by notification controller 50b causing touch panel 51 to display the above content on the screen.

In a case where determination unit 50a determines in step ST3 that "there is vacancy", further, determination unit 50a determines whether there is one carrier tape 18 installed on tape installation unit 32 (step ST5). The determination unit 50a makes this determination based on detection information from installation number measurer 42 sent from feeder controller 37 of target tape feeder 13.

In the present exemplary embodiment, the maximum number of carrier tapes 18 that can be inserted into tape installation unit 32 is two, and one (lower stage side installation port 32A) of carrier tapes 18 is occupied by the component supply tape. Therefore, if the number of carrier tapes 18 installed on tape installation unit 32 is one, determination unit 50a determines that "there is only one carrier tape 18 installed" and if the number of carrier tapes 18 installed on tape installation unit 32 is two, determination unit 50a determines that "there is no one carrier tape 18 attached".

In step ST5, in a case where determination unit 50a determines that "the number of carrier tapes 18 installed is one", furthermore, determination unit 50a determines whether the suppliable remaining amount of component PT by the component supply tape is equal to or less than the predetermined amount (step ST6). Determination unit 50a performs this determination based on the detection information from remaining amount measurer 43.

Here, the "predetermined amount" refers to the minimum remaining amount that can secure the time required for worker OP to perform the work of installing following tape 18B to upper stage side installation port 32B, among the suppliable remaining amount of component PT by the component supply tape. This minimum remaining amount can be calculated from the time required for the above working and the supply speed (feed speed of carrier tape 18 at a pitch in this case) of component PT by tape feeder 13.

In step ST6, in a case where determination unit 50a determines that the suppliable remaining amount of component PT by the component supply tape is not equal to or less than the predetermined amount, notification controller 50b notifies worker OP of the fact that there is no urgency in installation of following tape 18B and carrier tape 18 can be installed on tape installation unit 32 (step ST7). This notification is performed by notification controller 50b controlling touch panel 51 and causing touch panel 51 to display the notification content on the screen.

On the other hand, in step ST6, in a case where determination unit 50a determines that the suppliable remaining amount of component PT by the component supply tape is equal to or less than the predetermined amount, notification controller 50b notifies worker OP of the fact that there is urgency in installation of following tape 18B and it is necessary to install carrier tape 18 on tape installation unit 32 (step ST8). This notification is performed by notification controller 50b controlling touch panel 51 and causing touch panel 51 to display the notification content on the screen.

As described above, in the present exemplary embodiment, in a case where the number of carrier tapes 18 counted by installation number measurer 42 is one and the suppliable remaining amount of component PT by the component supply tape counted by remaining amount measurer 43 is equal to or less than the predetermined amount, the determination unit 50a determines tape installation unit 32 is in the installation required state.

In the present exemplary embodiment, since there are two installation ports to which carrier tape 18 can be installed on tape installation unit 32, it cannot be determined that "there is not one carrier tape 18 installed" in step ST5 after determining that "there is vacancy" in step ST3. However, in a case where there are three or more installation ports to which carrier tape 18 can be installed in tape installation unit 32, it can be determined in step ST5 that "there is not one carrier tape 18 attached (that is, the number of carrier tapes 18 which is installed on tape installation unit 32 being made is two or more)". In this case, since carrier tape 18 can be in a state of being installed on tape installation unit 32 and there is no urgency in installation of carrier tape 18, notification controller 50b notifies worker OP of the fact that the notification of step ST7 (notification of fact that carrier tape 18 can be installed) to tape installation unit 32 is performed.

As described above, in the present exemplary embodiment, in a case where the number of carrier tapes 18 counted by installation number measurer 42 is less than the number of carrier tapes 18 that can be installed on tape installation unit 32, and the suppliable remaining amount of component PT by the component supply tape counted by remaining amount measurer 43 is equal to or more than the predetermined amount or in a case where the number of carrier tape 18 counted by installation number measurer 42 is less than the number of carrier tapes 18 that can be installed to tape installation unit 32 and the number of carrier tapes 18 counted by installation number measurer 42 is two or more, the determination unit 50a determines that tape installation unit 32 is in an installation enabled state.

In the component supply working support control according to the present exemplary embodiment, step ST3, step ST5 and step ST6 are determining steps of determining whether tape installation unit 32 is in any of the installation disabled state where following tape 18B cannot be installed, the installation enabled state where following tape 18B can be installed, and the installation required state, where it is necessary to mount following tape 18B based on the supply state of the component in at least one carrier tape 18, installed on tape installation unit 32 detected in the supply state detecting step described above. In addition, step ST4, step ST7 and step ST8 are notifying steps for notifying worker OP of the state of tape installation unit 32 determined in the determining step.

As described above, in the component supply management system according to the present exemplary embodiment, the supply state of component PT in at least one carrier tape 18 installed to tape installation unit 32 of tape feeder 13 is first detected (step ST1 and step ST2). Next, it is determined whether tape installation unit 32 is in any of the "installation disabled state", the "installation enabled state" or the "installing required state" (step ST3, step ST5 and step ST6). Then, the result of the state of tape installation unit 32 is notified to worker OP (step ST4, step ST7 and step ST8). Therefore, worker OP can easily grasp the timing of installation of following tape 18B. Therefore, mistakes can be prevented in advance that worker OP installs carrier tape 18 although being not capable of installing carrier tape 18, quickly installs carrier tape 18 although the installation of carrier tape 18 is not urgent, and does not notice the fact that the installation of carrier tape 18 is urgent and cause supply of component PT to be stagnant. Therefore, according to the component supply management system in the present exemplary embodiment, it is possible to remarkably improve the work efficiency of the component supply working using tape feeder 13 as the component supply device.

In the exemplary embodiment described above, both functional units of determination unit 50a and notification controller 50b belong to control device 50, but these functional units may belong to feeder controller 37 of each tape feeder 13, furthermore, if the notification operation performed by touch panel 51 is performed by a lamp (at least three colors can be selectively displayed) provided in each tape feeder 13 or the like, each tape feeder 13 can have the function of the system equivalent to the component supply management system. In this case, notification controller 50b and the lamp function as a notifier. According to tape feeder 13 having such a configuration, since it is possible to execute the same component supply working method as the component supply management system described above, it is possible to obtain the same effect as the component supply management system described above.

Although exemplary embodiments of the present disclosure have been described so far, the present disclosure is not limited to the exemplary embodiments described above. For example, as tape feeder 13, the present disclosure can also be applied to a tape feeder in which a plurality of carrier tapes 18 can be installed on one tape installation port rather than a form in which carrier tape 18 is installed on each tape installation port of tape installation unit 32. In this case, it is necessary to determine that "it is not one carrier tape 18 attached" in step ST5 after determining "there is vacancy" in step ST3.

In addition, carrier tape 18 in the exemplary embodiment described above is one example of the accommodation body that accommodates component PT. Tape feeder 13 includes an accommodation body installation unit (tape installation unit 32) capable of simultaneously installing a plurality of accommodation bodies, and is as an example of a component supply device which operates so as to supply component PT from at least one of the accommodation unit installed on the accommodation body installation unit to the predetermined component supply position (component supply port 13K) and performs a component supply working. Therefore, a component feeding device (for example, a stick feeder) having the same configuration as tape feeder 13 can be used instead of tape feeder 13.

In a case where the component supply device is a stick feeder, a stick case accommodating a plurality of component PT arranged side by side corresponds to an accommodation body. The stick feeder includes a stick case installation unit as an accommodation body installation unit capable of simultaneously installing a plurality of accommodation bodies (stick cases) in a stacked state. Then, the operation is performed such that the component is supplied to a predetermined component supply position from one of one or more sticks case installed on a stepped state in the stick case installation unit.

In the stick feeder, the lowermost stick case among the plurality of stick cases stacked in the stick case installation unit serves as a component supply accommodation body and supplies the component. Then, when component PT in the component supply stick case, as a component supply accommodation body, becomes empty, the stick case thereof is discharged and total the stick case for replenishment which has been stacked down comes down by gravity, and the stick case positioned at the most lower stage becomes the next component supply accommodation body.

In this way, the stick feeder includes an accommodation body installation unit (stick case installation unit) capable of simultaneously installing a plurality of accommodation bodies (stick cases) accommodating component PT. Since it is a component supply device configured to operate so that components are supplied from one of one or more accommodation bodies installed on the accommodation body installation unit to a predetermined component supply position, it is possible to configure the same component supply management system as in a case of the exemplary embodiment described above, and therefore it is possible to obtain the same effect as described in the exemplary embodiment described above. In a case where the component supply device is a stick feeder, the suppliable remaining amount of component PT by the component supply stick case can be regarded as the remaining number of component PT in the component supply stick case itself, and can be regarded as the length of total the plurality of component PT arranged side by side in the component supply stick.

A component supply device, a component supply management system, and a component supply working support method are provided which can easily grasp the timing of installing of a following carrier tape and improve work efficiency of component supply work.

What is claimed is:

1. A component supply management system which manages component supply of a component supply device including an accommodation body installation unit in which one or more accommodation bodies each accommodating components are installable, the component supply management system comprising:
a determination unit configured to determine, based on a supply state of the components in the one or more accommodation bodies installed on the accommodation body installation unit, a state of the accommodation body installation unit among:
(i) an installation required state of being necessary to install a following accommodation body to the accommodation body installation unit, indicating vacancy in the accommodation body installation unit which is in a state where a component supply accommodation body which is an accommodation body currently performing the supply is close to a shortage of components when a remaining amount of components in the component supply accommodation body is equal to or less than a predetermined amount, and
(ii) an installation enabled state of being capable of installing the following accommodation body to the accommodation body installation unit, indicating that vacancy in the accommodation body installation unit is in a state prior to the installation required state where the component supply accommodation body is close to the shortage of components; and a notifier configured to notify of the determined state of the accommodation body installation unit.

2. The component supply management system of claim 1, further comprising:

a supply state detector configured to detect the supply state.

3. A component supply management system which manages component supply of a component supply device including an accommodation body installation unit in which one or more accommodation bodies each accommodating components are installable, the component supply management system comprising:

a determination unit configured to determine, based on a supply state of the components in the one or more accommodation bodies installed on the accommodation body installation unit, a state of the accommodation body installation unit among (i) an installation required state of being necessary to install a following accommodation body to the accommodation body installation unit, indicating vacancy in the accommodation body installation unit which is in a state where a component supply accommodation body which is an accommodation body currently performing the supply is close to a shortage of components and (ii) an installation enabled state of being capable of installing the following accommodation body to the accommodation body installation unit, indicating vacancy in the accommodation body installation unit before the accommodation body installation unit is in a state where the component supply accommodation body is closed to a shortage of components; and a notifier configured to notify of the state of the accommodation body installation unit, and a supply state detector configured to detect the supply state, wherein the determination unit determines a state of the accommodation body installation unit among the installation enabled state, the installation required state, and an installation disabled state of being incapable of installing the following accommodation body to the accommodation body installation unit, indicating no vacancy in the accommodation body installation unit.

4. The component supply management system of claim 2, wherein the supply state detector includes an installation number measurer which counts the number of the one or more accommodation bodies installed on the accommodation body installation unit, and a remaining amount measurer which counts a suppliable remaining amount of the components accommodated in a component supply accommodation body that is an accommodation body currently performing the supply among the one or more accommodation bodies, and wherein the determination unit configured to determine the state of the accommodation body installation unit among the installation enabled state and the installation required state based on the number of the one or more accommodation bodies counted by the installation number measurer and the suppliable remaining amount of the components counted by the remaining amount measurer.

5. The component supply management system of claim 4, wherein, when a number of the one or more accommodation bodies counted by the installation number measurer is less than a number of accommodation bodies installable on the accommodation body installation unit and the suppliable remaining amount of the components counted by the remaining amount measurer is equal to or more than a predetermined amount, or when the number of the one or more accommodation bodies counted by the installation number measurer is less than the number installable on the accommodation body installation unit and two or more, the determination unit determines that the accommodation body installation unit is in the installation enabled state.

6. The component supply management system of claim 4, wherein, when the number of the one or more accommodation bodies counted by the installation number measurer is one and the suppliable remaining amount of the components counted by the remaining amount measurer is equal to or less than a predetermined amount, the determination unit determines that the accommodation body installation unit is in the installation required state.

7. The component supply management system of claim 4, wherein each of the one or more accommodation bodies and the following accommodation body is a carrier tape which is inserted into and installed on the accommodation body installation unit and supplies each of the components by feeding the components at a pitch by a rotation operation of a sprocket, and wherein the remaining amount measurer counts the suppliable remaining amount of the components, based on at least one of (i) a remaining number of the components of the component supply accommodation body, (ii) a position of a boundary between an area in which the components are accommodated and an area in which the components are not accommodated in the component supply accommodation body, and (iii) a remaining length of the component supply accommodation body.

8. The component supply management system of claim 1, wherein the notifier configured to notify of the state of the accommodation body installation unit among the installation enabled state and the installation required state with different display modes.

9. The component supply management system of claim 1, wherein a lamp provided in each of the one or more accommodation bodies functions as the notifier.

10. A component supply working support method for supporting a component supply working using a component supply device including an accommodation body installation unit in which one or more accommodation bodies each accommodating components are installable, the component supply working support method comprising:

a determining step of determining, based on a supply state of the components in the one or more accommodation bodies installed on the accommodation body installation unit, a state of the accommodation body installation unit among:

(i) an installation required state of being necessary to install a following accommodation body to the accommodation body installation unit, indicating vacancy in the accommodation body installation unit which is in a state where a component supply accommodation body which is an accommodation body currently performing the supply is close to a shortage of components when a remaining amount of components in the component supply accommodation body is equal to or less than a predetermined amount, and (ii) an installation enabled state of being capable of installing the following accommodation body to the accommodation body installation unit, indicating that vacancy in the accommodation body installation unit is in a state prior to the installation required state where the component supply accommodation body is close to the shortage of components; and a notifying step of notifying of the determined state of the accommodation body installation unit determined by the determination unit.

11. The component supply working support method of claim 10, further comprising:

a supply state detecting step of detecting the supply state.

12. The component supply working support method of claim 10, wherein in the determining step, the state of the accommodation body installation unit among the installation enabled state, the installation required state, and an installation disabled state of being incapable of installing the following accommodation body to the accommodation body installation unit, indicating no vacancy in the accommodation body installation unit.

13. A component supply working support method for supporting a component supply working using a component supply device including an accommodation body installation unit in which one or more accommodation bodies each accommodating components are installable, the component supply working support method comprising:

a determining step of determining, based on a supply state of the components in the one or more accommodation bodies installed on the accommodation body installation unit, a state of the accommodation body installation unit among,
   (i) an installation required state of being necessary to install a following accommodation body to the accommodation body installation unit, indicating vacancy in the accommodation body installation unit which is in a state where a component supply accommodation body which is an accommodation body currently performing the supply is close to a shortage of components, and
   (ii) an installation enabled state of being capable of installing the following accommodation body to the accommodation body installation unit, indicating vacancy in the accommodation body installation unit before the accommodation body installation unit is in a state where the component supply accommodation body is closed to a shortage of components;

a notifying step of notifying of the state of the accommodation body installation unit determined by the determination unit; and a supply state detecting step of detecting the supply state, wherein the supply state detecting step includes an installation number measuring step of counting the number of the one or more accommodation bodies installed on the accommodation body installation unit, and a remaining amount measuring step of counting a suppliable remaining amount of the components accommodated in a component supply accommodation body that is an accommodation body currently performing the supply among the one or more accommodation bodies, and wherein in the determining step, the state of the accommodation body installation unit among the installation enabled state and the installation required state is determined based on the number of the one or more accommodation bodies measured in the installation number measuring step and the suppliable remaining amount of the components measured in the remaining amount measuring step.

14. The component supply working support method of claim 13, wherein, when a number of the one ore more accommodation bodies measured by the installation number measuring step is less than a number of accommodation bodies installable on the accommodation body installation unit and the suppliable remaining amount of the components measured in the remaining amount measuring step is equal to or more than a predetermined amount, or when the number of the one or more accommodation bodies measured in the installation number measuring step is less than the number installable on the accommodation body installation unit and two or more, in the determining step, it is determined that the accommodation body installation unit is in the installation enabled state.

15. The component supply working support method of claim 13, wherein, when the number of the one or more accommodation bodies measured in the installation number measuring step is one and the suppliable remaining amount of the components measured in the remaining amount measuring step is equal to or less than a predetermined amount, in the determining step, it is determined that the accommodation body installation unit is in the installation required state.

16. The component supply working support method of claim 13, wherein each of the one or more accommodation bodies and following accommodation body is a carrier tape which is inserted into and installed on the accommodation body installation unit and supplies each of the components to the predetermined component supply position by feeding the components at a pitch by a rotation operation of a sprocket, and wherein, in the remaining amount measuring step, the suppliable remaining amount of the component is measured, based on at least one of (i) a remaining number of the components of the component supply accommodation body, (ii) a position of a boundary between an area in which the components are accommodated and an area in which the components are not accommodated in the component supply accommodation body, and (iii) a remaining length of the component supply accommodation body.

17. The component supply working support method of claim 10, wherein the notifier configured to notify of the state of the accommodation body installation unit among the installation enabled state and the installation required state with different display modes.

18. The component supply working support method of claim 10, wherein a lamp provided in each of the one or more accommodation bodies functions as the notifier.

* * * * *